United States Patent
Rho et al.

(10) Patent No.: US 11,437,308 B2
(45) Date of Patent: Sep. 6, 2022

(54) PACKAGING GLASS SUBSTRATE FOR SEMICONDUCTOR, A PACKAGING SUBSTRATE FOR SEMICONDUCTOR, AND A SEMICONDUCTOR APPARATUS

(71) Applicant: ABSOLICS INC., Covington, GA (US)

(72) Inventors: Youngho Rho, Daejeon (KR); Sungjin Kim, Suwanee, GA (US); Jincheol Kim, Hwaseong-si (KR)

(73) Assignee: ABSOLICS INC., Covington, GA (US)

( * ) Notice: Subject to any disclaimer, the term of this patent is extended or adjusted under 35 U.S.C. 154(b) by 0 days.

(21) Appl. No.: 17/462,254

(22) Filed: Aug. 31, 2021

(65) Prior Publication Data
US 2021/0398891 A1    Dec. 23, 2021

Related U.S. Application Data

(63) Continuation of application No. PCT/KR2020/004165, filed on Mar. 27, 2020.
(Continued)

(51) Int. Cl.
*H01L 23/498* (2006.01)
*H01L 23/15* (2006.01)
(Continued)

(52) U.S. Cl.
CPC ...... *H01L 23/49827* (2013.01); *H01L 21/486* (2013.01); *H01L 23/15* (2013.01); *H01L 23/49833* (2013.01); *H01L 25/0652* (2013.01)

(58) Field of Classification Search
CPC ............... H01L 23/49827; H01L 23/15; H01L 23/49833; H01L 21/486
See application file for complete search history.

(56) References Cited

U.S. PATENT DOCUMENTS

| 4,835,598 A | 5/1989 | Higuchi et al. |
| 5,304,743 A | 4/1994 | Sen et al. |

(Continued)

FOREIGN PATENT DOCUMENTS

| CN | 1317163 A | 10/2001 |
| CN | 101039549 A | 9/2007 |

(Continued)

OTHER PUBLICATIONS

International Search Report dated Jul. 10, 2020 in counterpart International Patent Application No. PCT/KR2020/004165 (2 pages in English and 2 pages in Korean).

(Continued)

*Primary Examiner* — Phat X Cao
(74) *Attorney, Agent, or Firm* — NSIP Law

(57) ABSTRACT

A packaging glass substrate for semiconductor includes a glass substrate with a first surface and a second surface facing each other, and a plurality of core vias penetrating through the glass substrate in a thickness direction, wherein a plain line is a line linking places where the core vias are not formed, a via line is a line linking places where the core vias are formed, a stress difference value (P) is a value according to Equation (1), and the stress difference value (P) is 1.5 MPa or less, Equation (1): P=Vp−Np where P is a stress difference value measured at the same glass substrate, Vp is a difference between the maximum value and the minimum value of stress measured at the via line, and Np is a difference between the maximum value and the minimum value of stress measured at the plain line.

14 Claims, 9 Drawing Sheets

Related U.S. Application Data

(60) Provisional application No. 62/826,122, filed on Mar. 29, 2019, provisional application No. 62/826,144, filed on Mar. 29, 2019.

(51) Int. Cl.
  *H01L 21/48* (2006.01)
  *H01L 25/065* (2006.01)

(56) References Cited

U.S. PATENT DOCUMENTS

| | | | |
|---|---|---|---|
| 5,414,222 | A | 5/1995 | Sen et al. |
| 8,774,580 | B2 | 7/2014 | Bolle |
| 9,263,370 | B2 | 2/2016 | Shenoy et al. |
| 9,420,708 | B2 * | 8/2016 | Hibino ............ H01L 23/49827 |
| 9,768,090 | B2 | 9/2017 | Liang et al. |
| 10,483,210 | B2 * | 11/2019 | Gross .................. C03C 17/322 |
| 2002/0093120 | A1 | 7/2002 | Magni et al. |
| 2006/0202322 | A1 * | 9/2006 | Kariya ............ H01L 23/49827 |
| | | | 257/701 |
| 2008/0217761 | A1 | 9/2008 | Yang et al. |
| 2009/0117336 | A1 | 5/2009 | Usui et al. |
| 2012/0153463 | A1 | 6/2012 | Maeda |
| 2013/0050227 | A1 | 2/2013 | Petersen et al. |
| 2013/0069251 | A1 | 3/2013 | Kunimoto et al. |
| 2013/0293482 | A1 | 11/2013 | Burns et al. |
| 2014/0034374 | A1 | 2/2014 | Cornejo et al. |
| 2014/0116763 | A1 | 5/2014 | Sato et al. |
| 2014/0116767 | A1 | 5/2014 | Sato et al. |
| 2015/0235915 | A1 | 8/2015 | Liang et al. |
| 2015/0235936 | A1 | 8/2015 | Yu et al. |
| 2015/0235989 | A1 | 8/2015 | Yu et al. |
| 2015/0245486 | A1 | 8/2015 | Shin et al. |
| 2016/0286660 | A1 | 9/2016 | Gambino et al. |
| 2017/0040265 | A1 | 2/2017 | Park et al. |
| 2017/0064835 | A1 | 3/2017 | Ishihara et al. |
| 2017/0223825 | A1 | 8/2017 | Thadesar et al. |
| 2018/0068868 | A1 | 3/2018 | Jaramillo et al. |
| 2018/0240778 | A1 | 8/2018 | Liu et al. |
| 2018/0342451 | A1 | 11/2018 | Dahlberg et al. |

FOREIGN PATENT DOCUMENTS

| | | |
|---|---|---|
| CN | 101189921 A | 5/2008 |
| CN | 102097330 A | 6/2011 |
| CN | 102106198 A | 6/2011 |
| CN | 102122691 A | 7/2011 |
| CN | 102844857 A | 12/2012 |
| CN | 103208480 A | 7/2013 |
| CN | 106449574 A | 2/2017 |
| CN | 108878343 A | 11/2018 |
| CN | 109411432 A | 3/2019 |
| EP | 0 526 456 B1 | 8/1998 |
| JP | 2001-7531 A | 1/2001 |
| JP | 3173250 B2 | 6/2001 |
| JP | 2005-235497 A | 9/2005 |
| JP | 2007-281252 A | 10/2007 |
| JP | 3998984 B2 | 10/2007 |
| JP | 4012375 B2 | 11/2007 |
| JP | 2009-295862 A | 12/2009 |
| JP | 2010-80679 A | 4/2010 |
| JP | 2013-38374 A | 2/2013 |
| JP | 2013-537723 A | 10/2013 |
| JP | 2014-45026 A | 3/2014 |
| JP | 2014-72205 A | 4/2014 |
| JP | 2014-127701 A | 7/2014 |
| JP | 2014-139963 A | 7/2014 |
| JP | 2016-111221 A | 6/2016 |
| JP | 2016-136615 A | 7/2016 |
| JP | 2016-213466 A | 12/2016 |
| JP | 2016-225620 A | 12/2016 |
| JP | 2017-50315 A | 3/2017 |
| JP | 6110437 B2 | 4/2017 |
| JP | 2017-112209 A | 6/2017 |
| JP | 2018-120902 A | 8/2017 |
| JP | 2017-216398 A | 12/2017 |
| JP | 2018-116951 A | 7/2018 |
| JP | 2018-199605 A | 12/2018 |
| JP | 2019-16672 A | 1/2019 |
| KR | 10-1997-0050005 A | 7/1997 |
| KR | 10-0184043 B1 | 5/1999 |
| KR | 10-2001-0107033 A | 12/2001 |
| KR | 10-2002-0008574 A | 1/2002 |
| KR | 20-0266536 Y1 | 2/2002 |
| KR | 10-0447323 B1 | 9/2004 |
| KR | 10-0538733 B1 | 12/2005 |
| KR | 10-0687557 B1 | 2/2007 |
| KR | 10-0720090 B1 | 5/2007 |
| KR | 10-2007-0085553 A | 8/2007 |
| KR | 10-0794961 B1 | 1/2008 |
| KR | 10-0859206 B1 | 9/2008 |
| KR | 10-0870685 B1 | 11/2008 |
| KR | 10-2010-0044450 A | 4/2010 |
| KR | 10-2010-0097383 A | 9/2010 |
| KR | 10-2011-0112974 A | 10/2011 |
| KR | 10-2012-0023120 A | 3/2012 |
| KR | 10-2012-0051992 A | 5/2012 |
| KR | 10-1160120 B1 | 6/2012 |
| KR | 10-2013-0038825 A | 4/2013 |
| KR | 10-2014-0044746 A | 4/2014 |
| KR | 10-1466582 B1 | 11/2014 |
| KR | 10-1468680 B1 | 12/2014 |
| KR | 10-1486366 B1 | 1/2015 |
| KR | 10-2015-0014167 A | 2/2015 |
| KR | 10-1531097 B1 | 6/2015 |
| KR | 10-2015-0145697 A | 12/2015 |
| KR | 10-2016-0048868 A | 5/2016 |
| KR | 10-2016-0094502 A | 8/2016 |
| KR | 10-2016-0114710 A | 10/2016 |
| KR | 10-2016-0124323 A | 10/2016 |
| KR | 10-2016-0141516 A | 12/2016 |
| KR | 10-2017-0084562 A | 7/2017 |
| KR | 10-1760846 B1 | 7/2017 |
| KR | 10-2017-0126394 A | 11/2017 |
| KR | 10-1825149 B1 | 2/2018 |
| KR | 10-1825276 B1 | 2/2018 |
| KR | 10-2018-0040498 A | 4/2018 |
| KR | 10-2018-0067568 A | 6/2018 |
| KR | 10-2018-0088599 A | 8/2018 |
| KR | 10-2018-0116733 A | 10/2018 |
| KR | 10-1903485 B1 | 10/2018 |
| KR | 10-2019-0002622 A | 1/2019 |
| KR | 10-2019-0008103 A | 1/2019 |
| KR | 10-1944718 B1 | 2/2019 |
| KR | 10-2019-0026676 A | 3/2019 |
| TW | 201929100 A | 7/2019 |
| WO | WO 2004/053983 A1 | 6/2004 |
| WO | WO 2006/050205 A2 | 5/2006 |
| WO | WO 2008/013054 A1 | 1/2008 |
| WO | WO 2008/105496 A1 | 9/2008 |
| WO | WO 2012/061304 A1 | 5/2012 |
| WO | WO 2015/198912 A1 | 12/2015 |
| WO | WO 2016/052221 A1 | 4/2016 |
| WO | WO 2017/188281 A1 | 11/2017 |

OTHER PUBLICATIONS

Written Opinion dated Jul. 10, 2020, in counterpart International Patent Application No. PCT/KR2020/004165 (3 pages in English and 3 pages in Korean).

* cited by examiner (a)

(b)

(a)

(b)

PACKAGING GLASS SUBSTRATE FOR SEMICONDUCTOR, A PACKAGING SUBSTRATE FOR SEMICONDUCTOR, AND A SEMICONDUCTOR APPARATUS

CROSS-REFERENCE TO RELATED APPLICATIONS

This application is a continuation of International Application No. PCT/KR2020/004165 filed on Mar. 27, 2020, which claims the benefit of US Provisional Patent Application No. 62/826,122, filed on Mar. 29, 2019, and US Provisional Patent Application No. 62/826,144 filed on Mar. 29, 2019, the entire disclosures of which are incorporated herein by reference for all purposes.

BACKGROUND

1. Field

The present disclosure relates to a packaging glass substrate for semiconductor, a packaging substrate for semiconductor, and a semiconductor apparatus.

2. Description of the Background

In the manufacturing of electronic components, the implementation of a circuit on a semiconductor wafer is referred to as a Front-End Process (FE), and the assembly of a wafer such that it can be actually used in a product is referred to as a Back-End Process (BE). A packaging process is included in the Back-End process.

Four key technologies of the semiconductor industry that enable the rapid development of electronic products in recent years include semiconductor technology, semiconductor packaging technology, manufacturing process technology, and software technology. Semiconductor technology has been developed in various forms such as line width of a nanometer unit, which is smaller than a micrometer unit, 10 million or more cells, high-speed operation, and much heat dissipation, but technology of packaging it completely is not supported yet. Thus, the electrical performance of semiconductors may be determined by the packaging technology and the resulting electrical connection rather than the performance of the semiconductor itself.

Ceramic or resin is used as the material of a packaging substrate. In the case of a ceramic substrate such as Si substrate, it is not easy to mount a high-performance and high-frequency semiconductor element thereon due to a high resistance or high dielectric constant. In the case of a resin substrate, it is possible to mount a high-performance and high-frequency semiconductor element thereon, but there is a distinct limitation to the reduction of pitches of wirings.

Recently, research is being conducted to apply silicon or glass to a high-end packaging substrate. By forming a through-via on a silicon or glass substrate and applying a conductive material into the through-via, it is possible to shorten a length of conductive lines between an element and a motherboard, and have excellent electric characteristics.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a packaging glass substrate for semiconductor includes a glass substrate with a first surface and a second surface facing each other, and a plurality of core vias penetrating through the glass substrate in a thickness direction, wherein a via line is a line linking places where the core vias are formed, and a stress difference value (P) is a value according to Equation (1), and the stress difference value (P) is 1.5 MPa or less, Equation (1): $P=V_p-N_p$ where P is a stress difference value measured at the same glass substrate, $V_p$ is a difference between the maximum value and the minimum value of stress measured at the via line, and $N_p$ is a difference between the maximum value and the minimum value of stress measured at the plain line.

The $V_p$ value may be 2.5 MPa or less.

The $N_p$ value may be 1.0 MPa or less.

The core via may be disposed in the number of 100 to 3000, based on a unit area (1 cm×1 cm) of the glass substrate.

A packaging substrate for semiconductor may include the packaging glass substrate for semiconductor, a core layer disposed on a surface of the core via, and a core seed layer configured as a seed for forming an electrically conductive layer.

The electrically conductive layer may include a core distribution pattern.

A semiconductor apparatus may include a semiconductor element unit having one or more semiconductor elements, the packaging substrate for semiconductor electrically connected to the semiconductor element unit, and a motherboard electrically connected to the packaging substrate, transmitting electrical signals of the one or more semiconductor elements and externally, and connected to the one or more semiconductor elements.

In another general aspect, a packaging glass substrate for semiconductor includes a glass substrate with a first surface and a second surface facing each other, and a plurality of core vias penetrating through the glass substrate in a thickness direction, wherein a plain line is a line linking places where the core vias are not formed, a via line is a line linking places where the core vias are formed, a target line is a plain line or a via line, and a stress difference ratio (K) is a value according to Equation (2), and the stress difference ratio (K) is 6 or less, Equation (2): $K=L_p/L_a$ where K is a stress difference ratio measured at the same plane of the same glass substrate, $L_p$ is a difference between the maximum value and the minimum value of stress measured at the target line, and $L_a$ is an average value of stress measured at the target line.

The target line may be a plain line, and the stress difference ratio (K) may be 2 or less.

The target line may be a via line.

A semiconductor apparatus may include a semiconductor element unit having one or more semiconductor elements, the packaging substrate for semiconductor electrically connected to the semiconductor element unit, and a motherboard electrically connected to the packaging substrate, transmitting electrical signals of the one or more semiconductor elements and external signals, and connected to the semiconductor element unit.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
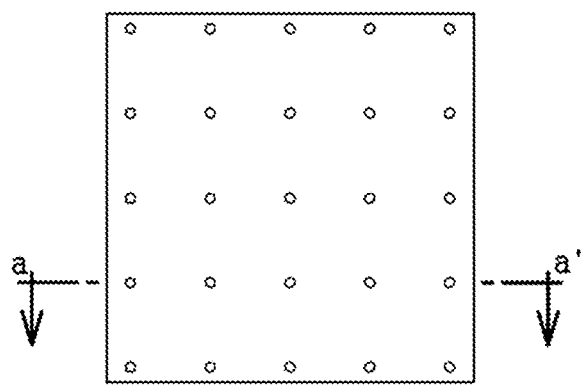
FIG. 1 is a conceptual view for illustrating a top view of a glass substrate having a core via applied in example embodiments of the present disclosure in (a) of FIG. 1 and a cross section of the core via in (b) of FIG. 1.
Figure 1:
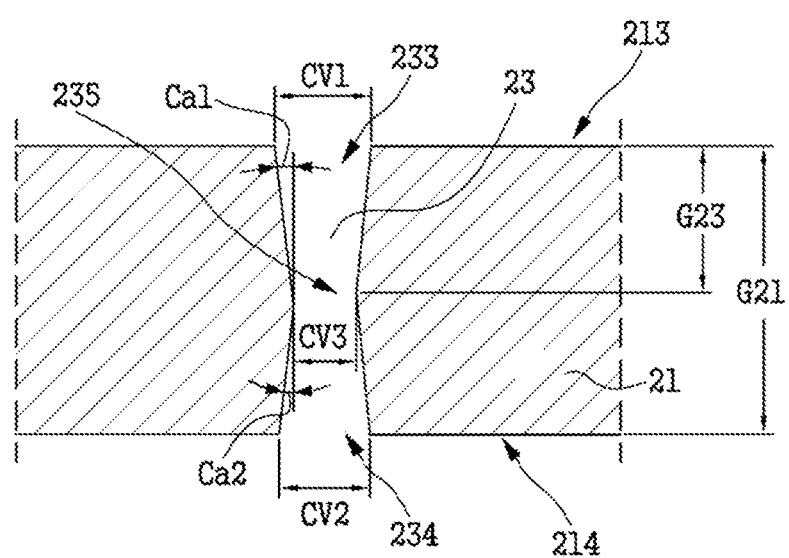

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the present disclosure, the phrase "combination(s) thereof" included in a Markush-type expression denotes one or more mixtures or combinations selected from the group consisting of components stated in the Markush-type expression, that is, denotes that one or more components selected from the group consisting of the components are included.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Throughout the present disclosure, the term "X-based" may mean that a compound includes a compound corresponding to X, or a derivative of X.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Technical Problem

The objective of the present disclosure is to provide a packaging glass substrate for semiconductor, a packaging substrate for semiconductor, a semiconductor apparatus, and the like, which can be used to manufacture a more integrated semiconductor apparatus by applying a glass substrate of which stress is controlled and a semiconductor apparatus packaging substrate including the same, and the like.

Effects

A glass substrate for semiconductor packaging, a substrate for semiconductor packaging, and a semiconductor apparatus of the embodiments can significantly improve electrical properties such as a signal transmission rate by connecting the semiconductor element and a motherboard to be closer to each other so that electrical signals are transmitted through as short a path as possible.

Additionally, since the glass substrate applied as a core of substrate is an insulator itself, there is a lower possibility of generating parasitic element compared to a conventional silicon core, and thus it is possible to simplify the treatment process for insulating layer and it is also applicable to a high-speed circuit.

In addition, unlike a silicon being manufactured in the form of a round wafer shape, the glass substrate is manufactured in the form of a large panel, and thus mass production is relatively easy and economic efficiency can be further improved.

Since the embodiment applies a glass substrate of which stress is controlled, it may have excellent mechanical properties despite formation of core vias.

The inventors have recognized that, in the process of developing a semiconductor apparatus capable of exhibiting high performance with a more integrated and thinner thickness, not only the apparatus itself but also the packaging process is an important factor for improving its performance. Also, inventors have confirmed that, by applying a glass core in a single layer and controlling the shape of a through-via, an electrically conductive layer formed thereon, etc., it is possible to make a packaging substrate thinner and to improve the electrical properties of the semiconductor apparatus, unlike a conventional interposer and organic substrate in which two or more layers of cores are applied on a motherboard as a packaging substrate.

When a through-hole-shaped core via is formed on a thin glass substrate, partial concentration of stress is easy to occur during the machining process, and this may induce degradation of mechanical properties. It becomes one of the main causes of decreasing workability during a complicated process of manufacturing a packaging substrate. In the embodiments described herein, a substrate for packaging applied with a glass substrate of which such concentration of stress is controlled is provided.

Figure 2:
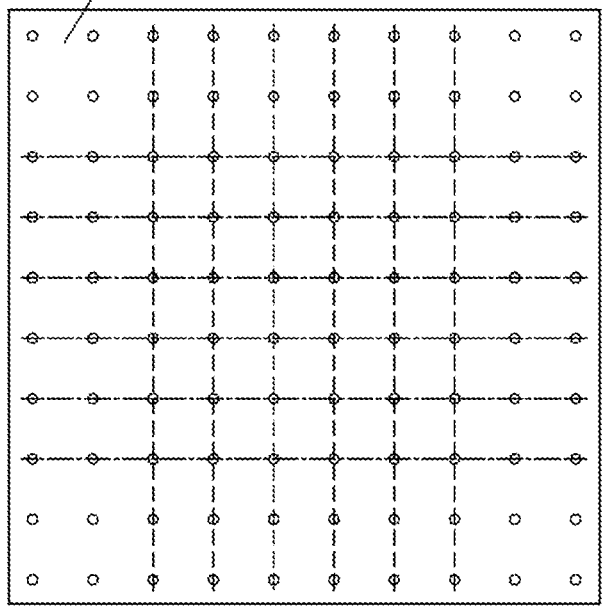
FIG. 2 are conceptual views for illustrating a method of measuring stress in the present disclosure, wherein (a) of FIG. 2 shows a route for measuring stress of a via line, and (b) of FIG. 2 shows a route for measuring stress of a plain line.
Figure 2:
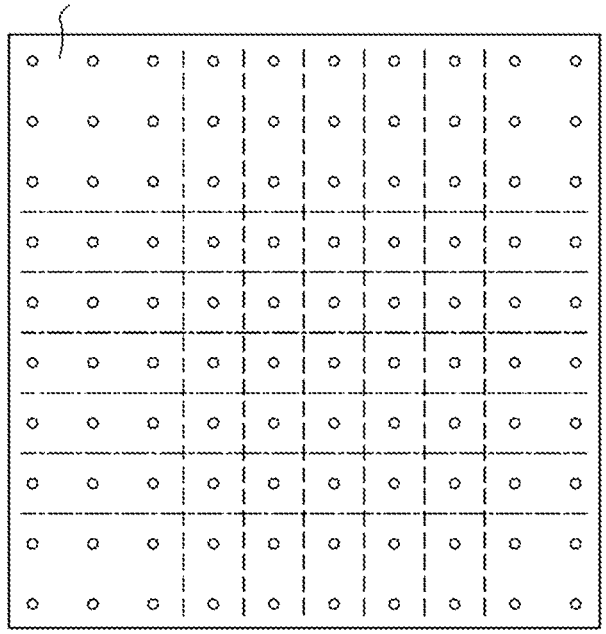
Figure 3:
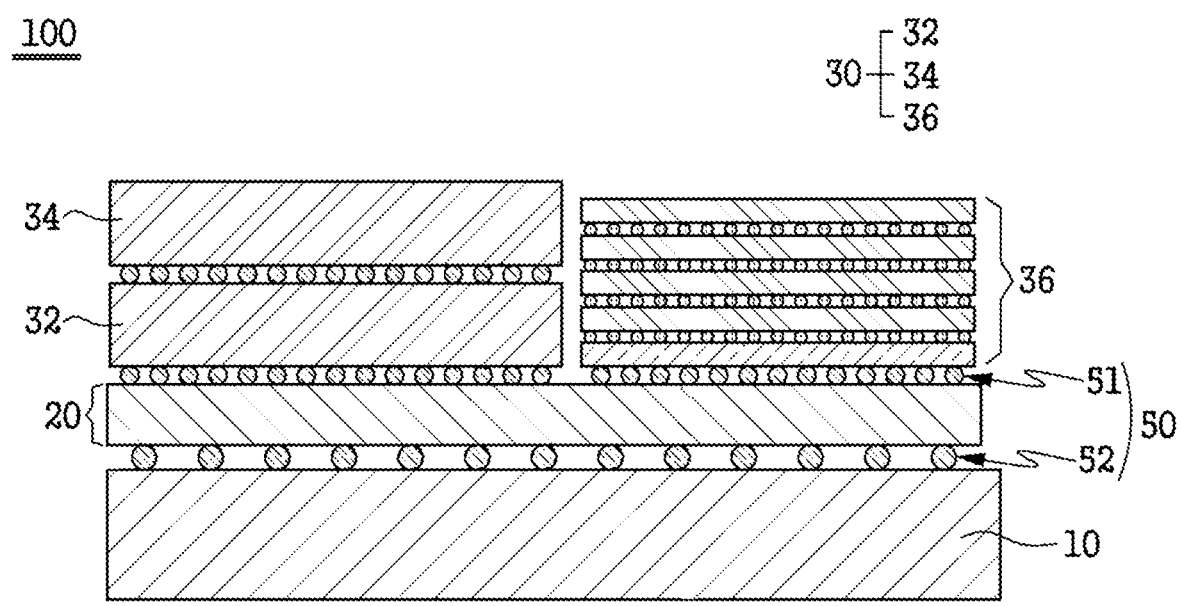
FIG. 3 is a conceptual view for illustrating a cross section of a semiconductor apparatus according to one or more embodiments of the present disclosure.
Figure 4:
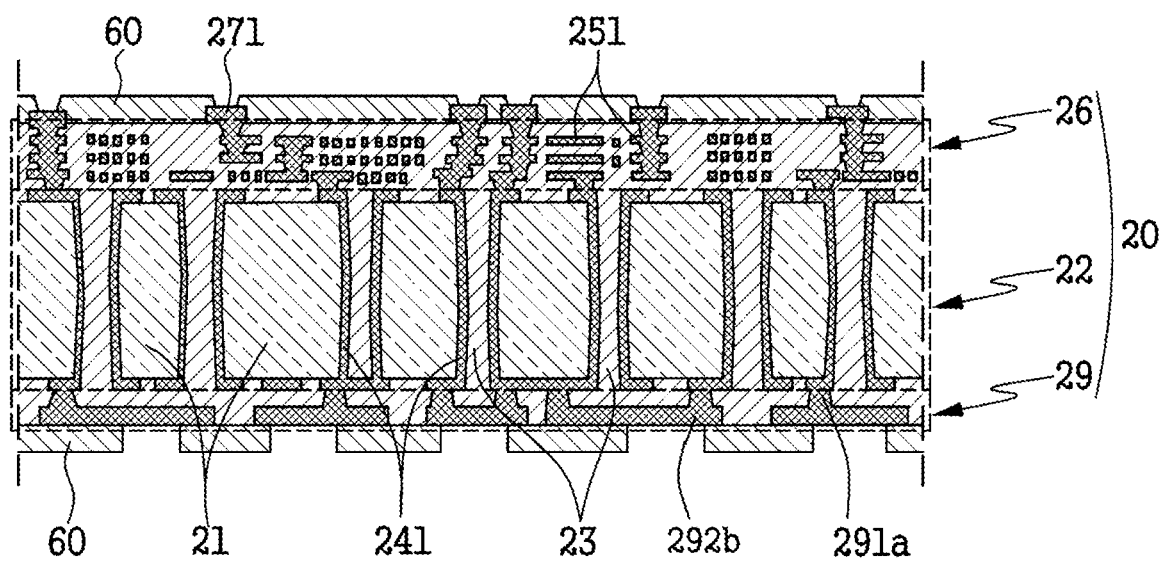
FIG. 4 is a conceptual view for illustrating a cross section of a packaging substrate according to one or more other embodiments of the present disclosure.
Figure 5:
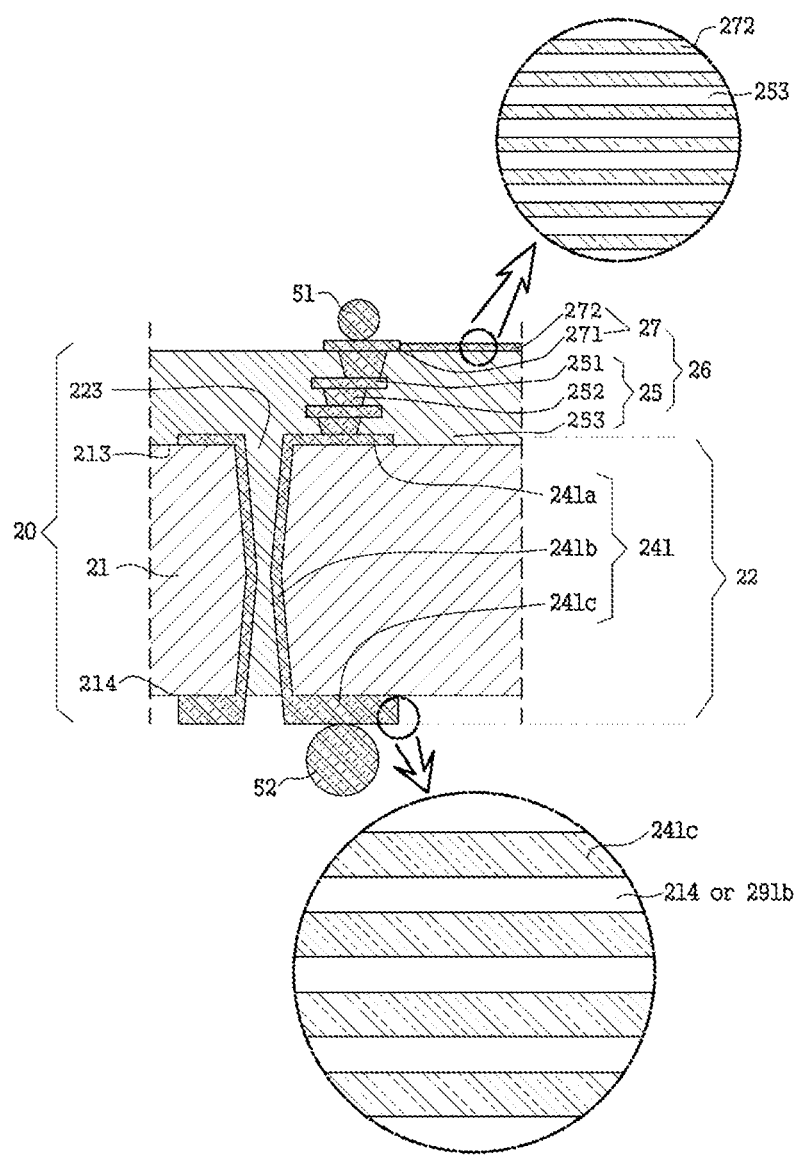
FIGS. 5 and 6 are detailed conceptual views for illustrating some of cross sections of a packaging substrate according to example embodiments of the present disclosure, respectively (a circle indicates a view obtained through observation from the top or the bottom).
Figure 6:
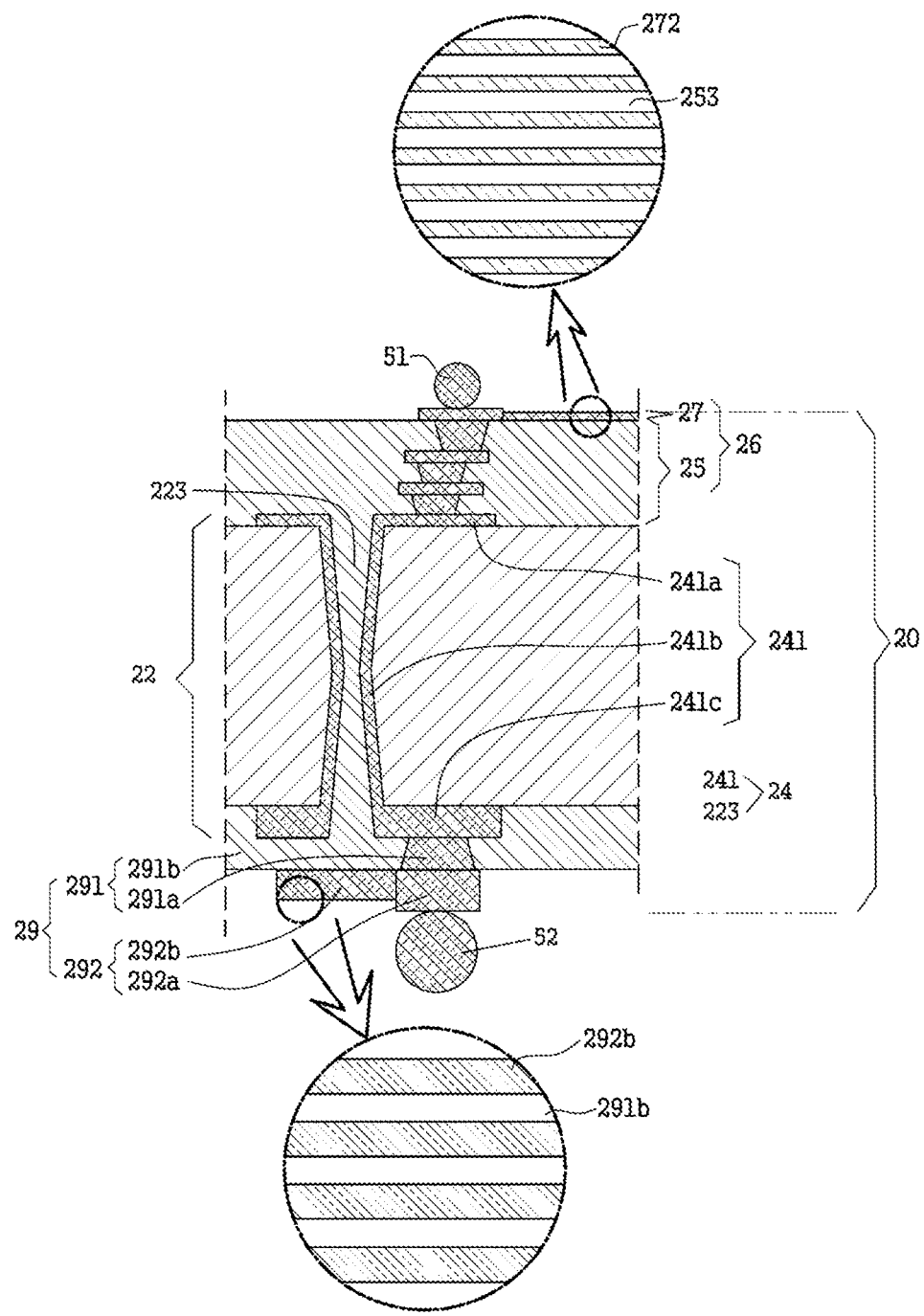

FIG. 1 is a conceptual view for illustrating a top view, in (a) of FIG. 1, of a glass substrate having a core via applied in embodiments of the present disclosure and a cross section of the core via in (b) of FIG. 1, and FIG. 2 are conceptual views for illustrating a method of measuring stress in the present disclosure, wherein (a) of FIG. 2 shows a route for measuring stress of a via line, and (b) of FIG. 2 shows a route for measuring stress of a plain line. FIG. 3 is a conceptual view for illustrating a cross section of a semiconductor apparatus according to one or more embodiments of the present disclosure, FIG. 4 is a conceptual view for illustrating a cross section of a packaging substrate according to one or more other embodiments of the present disclosure, and FIGS. 5 and 6 are detailed conceptual views for illustrating some of cross sections of a packaging substrate according to example embodiments of the present disclosure, respectively (a circle indicates a view obtained through observation from the top or the bottom). Hereinafter, with reference to FIGS. 1 and 2, a substrate for a semiconductor packaging will be described in detail, and with reference to FIGS. 3 to 6, a packaging substrate, and a semiconductor apparatus will be described in detail.

To achieve the above objectives, a substrate for semiconductor packaging 215 includes a glass substrate 21, a core via 23, and a core layer 22.

A glass substrate 21 has a first surface 213 and a second surface 214 facing each other.

A core seed layer or a core distribution pattern 241 is disposed at a core layer 22.

A core seed layer is disposed on a surface of the core via and configured as a seed for forming an electrically conductive layer.

A core distribution pattern 241 is an electrically conductive layer disposed on a surface of the core via 23.

As the glass substrate 21, a glass substrate applied to semiconductor is preferable. For example, a borosilicate glass substrate, a non-alkali glass substrate, or the like may be applicable, but the present disclosure is not limited thereto.

The glass substrate 21 may have a thickness of 1,000 μm or less. The glass substrate 21 may have a thickness of 100 to 1,000 μm, or 100 to 700 μm. The glass substrate 21 may have a thickness of 100 to 500 μm.

Forming a thinner packaging substrate is advantageous in that electrical signal transmission can be made more efficient. However, the glass substrate also should serve as a supporting body which supports semiconductor elements disposed thereon, so it is preferable to have the above thickness.

The thickness of the glass substrate refers to the thickness of the glass substrate itself except for the thickness of the electrically conductive layer on the glass substrate.

The core vias 23 may be formed by removing a predetermined region of the glass substrate 21, and in particular, it may be formed by etching a glass plate physically and/or chemically.

Formation of the core via 23 may be applied with a method of forming a defect (flaw) on the surface of the glass substrate by means of a laser and the like and then etching chemically, laser etching, etc., but the present disclosure is not limited thereto.

A stress of the glass substrate 21 may be measured at a plain line or a via line.

A plain line is a line linking places where the core via 23 is not formed on a first surface 213. A via line is a line linking places where the core via 23 is formed on a first surface 213.

A stress difference value (P) is represented by the below Equation (1).

The glass substrate 21 may have a stress difference value (P) of 1.5 MPa or less.

$$P = Vp - Np \qquad \text{Equation (1)}$$

In the Equation (1), the Vp is a difference between the maximum value and the minimum value of stress measured at a via line, and the Np is a difference between the maximum value and the minimum value of stress measured at a plain line.

The P value may be 1.35 MPa or less, 1.2 MPa or less or 1.1 MPa or less. Also, the P value may be 0.01 MPa or more, or 0.1 MPa or more.

When a glass substrate with the above stress difference value (P) is applied as a substrate for semiconductor packaging, it is possible to manufacture a packaging substrate having more stable mechanical properties.

The Vp value of the glass substrate may be 2.5 MPa or less. The Vp value of the glass substrate may be or 2.3 MPa or less, and the Vp value may be 2.0 MPa or less. The Vp value of the glass substrate may be 1.8 MPa or less. The Vp value of the glass substrate may be 0.2 MPa or more. The Vp value of the glass substrate may be 0.4 MPa or more.

When a glass substrate with difference (Vp) in these ranges between the maximum value and the minimum value of stress measured at a via line, is applied as a substrate for semiconductor packaging, it is possible to manufacture a packaging substrate having more stable mechanical properties.

The Np value of the glass substrate may be 1.0 MPa or less. The Np value of the glass substrate may be 0.9 MPa or less, or 0.8 MPa or less. The Np value of the glass substrate may be 0.1 MPa or more. The Np value of the glass substrate may be 0.2 MPa or more.

When a glass substrate whose difference (Np) in these ranges between the maximum value and the minimum value of stress measured at a plain line, is applied as a substrate for semiconductor packaging, it is possible to manufacture a packaging substrate having more stable mechanical properties.

A stress difference ratio (K) is represented by the below Equation (2).

A target line is the one selected from a plain line which is a line linking places where a core via is not formed, or a via line which is a line linking places where a core via is formed.

The glass substrate may have a stress difference ratio (K) of 6 or less.

$$K = Lp/La \quad \text{Equation (2):}$$

In the Equation (2), the K is a stress difference ratio measured at the same plane of the same glass substrate, the Lp is a difference between the maximum value and the minimum value of stress measured at the target line, and the La is an average value of stress measured at the target line.

The K value of the glass substrate may be 5 or less, 4.5 or less, or 4 or less. When a glass substrate with the above K value is applied as a substrate for semiconductor packaging, it is possible to manufacture a packaging substrate having more stable mechanical properties.

A stress difference ratio measured at a plain line is represented as Kn.

The stress difference ratio (Kn) at a plain line may be 2 or less. The stress difference ratio (Kn) at a plain line may be 1.8 or less. The stress difference ratio (Kn) at a plain line may be more than 0.3. The stress difference ratio (Kn) at a plain line may be more than 0.5.

A stress difference ratio measured at a via line is represented as Kv.

The stress difference ratio (Kv) at a via line may be 6 or less. The stress difference ratio (Kv) of a via line may be 5 or less. The stress difference ratio (Kv) of a via line may be 4.5 or less, or 3 or less. The stress difference ratio (Kv) of a via line may be 0.5 or more. The stress difference ratio (Kv) at a via line may be 1.0 or more, or 1.5. or more.

When a glass substrate with these Kn and Kv values is applied as a substrate for semiconductor packaging, it is possible to manufacture a packaging substrate having more stable mechanical properties.

The stress is analyzed by applying a birefringence 2D evaluation device. In detail, the birefringence 2D dispersion evaluation device may be WPA-200 device of NPM (NIPPON PULSE KOREA CO., LTD).

For example, when data are read on a glass substrate along to a stress measuring route shown in FIG. 2 by a probe, measured values such as a birefringence value are inputted by the device, and stress in a measuring route is presented by pressure unit (ex. MPa) through a predetermined calculation process.

In this time, stress can be measured by inputting a light elastic coefficient and the thickness of a measuring target, and 2.4 is applied as the light elastic value in the examples.

The core via 23 may be disposed in the number of 100 to 3000, or 100 to 2500, or 225 to 1024, based on a unit area (1 cm×1 cm) of the glass substrate 21. When satisfying these pitch conditions, it is more advantageous to form an electrically conductive layer, etc., and is possible to improve the performance of packaging substrate.

The core via 23 may be disposed in the glass substrate 21 in a pitch of 1.2 mm or less, may be disposed in a pitch of 0.12 mm to 1.2 mm, may be disposed in a pitch of 0.3 mm to 0.9 mm. In this case, it is advantageous to form an electrically conductive layer, etc., while maintaining the mechanical properties of the glass substrate above certain level.

A core via 23 may include a first opening part 233 in contact with the first surface; a second opening part 234 in contact with the second surface; and a minimum inner diameter part 235 having the smallest inner diameter in the entire core via connecting the first opening part and the second opening part.

A diameter CV1 of the first opening part and a diameter CV2 of the second opening part may be substantially different. A diameter CV1 of the first opening part and a diameter CV2 of the second opening part may be substantially the same.

The core via 22 may have one place of smaller inner diameter than the other places, in the inner diameter surfaces connecting the first opening part and the second opening part, and it is referred to as a minimum inner diameter.

The minimum inner diameter part may be disposed at the first opening part or the second opening part. In this case, the core via may be a cylindrical type or a (truncated) triangular pyramid type core via. In this case, a diameter CV3 of the minimum inner diameter part corresponds to the diameter of the smaller one between the first opening part and the second opening part.

The minimum inner diameter part may be disposed between the first opening part and the second opening part. In this case, the core via may be a barrel type core via. In this case, the diameter CV3 of the minimum inner diameter part may be smaller than the larger one between the diameter of the first opening part and the diameter of the second opening part.

The diameter of the first opening part and the diameter of the second opening part may be comparatively constant on the overall glass substrate 21, respectively. Also, the inner diameter of the narrowest part in the core via (Minimum inner diameter) may be comparatively constant on the overall glass substrate 21.

The minimum inner diameter may have an average diameter of 50 μm to 95 μm.

$$0.83 \times D_{90} \leq D_{50} \leq 1.25 \times D_{10} \quad \text{Equation (3):}$$

In the Equation (3), $D_{50}$ is a value corresponding to 50% from the diameter distribution of the minimum inner diameters, $D_{90}$ is a value corresponding to 90% from the diameter distribution of the minimum inner diameters, and $D_{10}$ is a value corresponding to 10% from the diameter distribution of the minimum inner diameters.

The minimum inner diameter may be the one satisfying the condition of the below Equation (3-1).

$$0.88 \times D_{90} \leq D_{50} \leq 1.18 \times D_{10} \qquad \text{Equation (3-1):}$$

In the Equation (3-1), $D_{50}$ is a value corresponding to 50% from the diameter distribution of the minimum inner diameters, $D_{90}$ is a value corresponding to 90% from the diameter distribution of the minimum inner diameters, and $D_{10}$ is a value corresponding to 10% from the diameter distribution of the minimum inner diameters.

The target opening part corresponding to the larger one between the diameter of the first opening part and the diameter of the second opening part, may have an average diameter of 70 μm to 120 μm.

The target opening part corresponding to the larger one between the diameter of the first opening part and the diameter of the second opening part, may satisfy the condition of the below Equation (4).

$$0.9 \times D_{90} \leq D_{50} \leq 1.1 \times D_{10} \qquad \text{Equation (4):}$$

In the Equation (4), $D_{50}$ is a value corresponding to 50% from the diameter distribution of the target opening parts, $D_{90}$ is a value corresponding to 90% from the diameter distribution of the target opening parts, and $D_{10}$ is a value corresponding to 10% from the diameter distribution of the target opening parts.

The target opening part corresponding to the larger one between a diameter of the first opening part and a diameter of the second opening part, may have an average diameter of 80 μm to 105 μm.

The target opening part corresponding to the larger one between the diameter of the first opening part and the diameter of the second opening part, may satisfy the condition of the below Equation (4-1).

$$0.92 \times D_{90} \leq D_{50} \leq 1.08 \times D_{10} \qquad \text{Equation (4-1):}$$

In the Equation (4-1), $D_{50}$ is a value corresponding to 50% from the diameter distribution of the target opening parts, $D_{90}$ is a value corresponding to 90% from the diameter distribution of the target opening parts, and $D_{10}$ is a value corresponding to 10% from the diameter distribution of the target opening parts.

The target opening part of the core via, corresponding to the larger one between a diameter of the first opening part which is a diameter at an opening part in contact with the first surface, and a diameter of the second opening part which is a diameter at an opening part in contact with the second surface, may have an average diameter of larger value than $D_{50}$, which is a value corresponding to 50% from the diameter distribution of the target opening parts.

The diameter distribution described above, is evaluated based on a diameter which is observed by microscope in the cross-section, after dividing prepared samples into 9 compartments (3×3), and processing of cutting the samples of 5 areas (top left, bottom left, center, top right, bottom right), and measured.

When the entire length G21 of the core via is 100%, the point at which the minimum inner diameter part is located may be the point G23 of 40% to 60% based on the first opening part, and may be the point of 45% to 55%. When the minimum inner diameter part is at the position described above, based on the entire length of core via, the design of electrically conductive layer of packaging substrate and the process of forming electrically conductive layer may be easier.

The angle (Ca1) of the inner diameter surface connecting the inner diameter of the minimum inner diameter part and the first opening part, and the angle (Ca2) of the inner diameter surface connecting the inner diameter part of the minimum inner diameter part and the second opening part, may have a ratio of 1:0.7 to 1.3. In this case, since the angle difference between the inner diameter surface of the core via starting from the first opening and the inner diameter surface of the core via starting from the second opening is insignificant, the subsequent plating process, etc. may proceed more smoothly.

The angle is evaluated as an angle with an imaginary reference line perpendicular to the first surface or the second surface, and evaluated as an absolute value regardless of the direction (hereinafter the same).

The larger angle between the angle (Ca1) of the inner diameter surface connecting the inner diameter of the minimum inner diameter part and the first opening part, and the angle (Ca2) of the inner diameter surface connecting the inner diameter of the minimum inner diameter part and the second opening part, may be 8 degrees or less, may be 0.1 to 8 degrees, and may be 0.5 to 6.5 degrees. In the case of having such an angle, the efficiency of subsequent processes such as plating can be further improved.

The thickness of the electrically conductive layer measured at a larger one between the diameter (CV1) of the first opening part and the diameter (CV2) of the second opening part, may be same as or thicker than the thickness of an electrically conductive layer formed on the part CV3 having the minimum inner diameter among the core vias.

A semiconductor apparatus 100 and a packaging substrate 20 will be described in further detail.

A semiconductor apparatus 100 in one embodiment includes a semiconductor element unit 30 where one or more semiconductor elements 32, 34, and 36 are disposed; a packaging substrate 20 electrically connected to the semiconductor elements; and a motherboard 10 electrically connected to the packaging substrate, transmitting electrical signals of the semiconductor element and external, and connecting each other.

The packaging substrate 20 according to another embodiment includes a core layer 22 and an upper layer 26.

The core layer 22 includes a substrate for semiconductor packaging 215 described in the above.

The semiconductor element unit 30 refers to elements mounted on a semiconductor apparatus and is mounted on the packaging substrate 20 by connecting electrode and the like. In detail, for example, a computation element such as CPU and GPU (a first element 32 and a second element 34), a memory element such as a memory chip (a third element 36), and the like may be applied as the semiconductor element unit 30, but any semiconductor element mounted on a semiconductor apparatus is applicable without limitations.

A motherboard such as a printed circuit board and a printed wiring board may be applied as the motherboard 10.

The packaging substrate 20 includes a core layer 22 and an upper layer 26 disposed on one surface of the core layer.

The packaging substrate 20 may further include a lower layer 29 disposed under the core layer, optionally.

The core layer 22 includes a glass substrate 21; a plurality of core vias 23 penetrating through the glass substrate in a thickness direction; and a core distribution layer 24 disposed on a surface of the glass substrate or a surface of the core via, and where an electrically conductive layer, at least a part of which electrically connect electrically conductive layers on the first surface and the second surface through the core via, is disposed.

The glass substrate 21 has a first surface 213 and a second surface 214 facing each other, and these two surfaces are generally parallel to each other thereby having a constant thickness in the glass substrate overall.

A core via 23 penetrating through the first surface and the second surface is disposed in the glass substrate 21.

Conventionally, a silicon substrate and an organic substrate were applied in a form of stacked, as the packaging substrate of the semiconductor apparatus. In case of a silicon substrate, when it is applied to a high-speed circuit, a parasitic element effect may occur due to the semiconductor property thereof, and it has a disadvantage of relatively large power loss. Also, in case of an organic substrate, it requires a larger area to form a more complicated distribution pattern, but this does not correspond to the miniaturization trend of electronic apparatus. In order to form a complicated distribution pattern within a predetermined size, it is necessary to make patterns finer substantially, but there has been a practical limit to the miniaturization of the patterns due to a material property of the organic substrate.

In the embodiments described herein, the glass substrate 21 is applied as a supporting body for the core layer 22 to solve these problems. Also, by applying the glass substrate and the core via 23 formed to penetrate the glass substrate, it is possible to provide a packaging substrate 20 having a shortened electrical flow length, a smaller size, a faster response, and a lower loss property.

The core distribution layer 24 includes a core distribution pattern 241 and a core insulating layer 223.

A core distribution pattern 241 is an electrically conductive layer which electrically connects the first surface and the second surface of the glass substrate through a through-via.

A core insulating layer 223 surrounds the core distribution pattern 241.

The core layer 22 has an electrically conductive layer formed therein through a core via, and thus serves as an electrical passage crossing the glass substrate 21, and may connect upper and lower parts of the glass substrate with a relatively short distance to have faster electrical signal transmission and lower loss properties.

The core distribution pattern 241 is a pattern that electrically connects the first surface 213 and the second surface 214 of the glass substrate through the core via 23.

The core distribution pattern 241 includes a first surface distribution pattern 241*a*, a second surface distribution pattern 241*c*, and a core via distribution pattern 241*b*.

A first surface distribution pattern 241*a* is an electrically conductive layer disposed on at least a part of the first surface 213. A second surface distribution pattern 241*c* is an electrically conductive layer disposed on at least a part of the second surface 214. A core via distribution pattern 241*b* is an electrically conductive layer electrically connecting the first surface distribution pattern and the second surface distribution pattern to each other through the core via 23.

As the electrically conductive layer, for example, a copper plating layer may be applicable, but the present disclosure is not limited thereto.

The glass substrate 21 serves as an intermediate role and an intermediary role for connecting a semiconductor element 30 and a motherboard 10 to the upper and lower parts, respectively. The core via 23 serves as a passage for transmitting electrical signals thereof, thereby facilitating seamless signal transmission.

A thickness of an electrically conductive layer measured at the larger one between the diameter of the first opening part, and the diameter of the second opening part may be equal to or thicker than a thickness of an electrically conductive layer formed on a part having the minimum inner diameter within the core via.

The core distribution layer 24 is an electrically conductive layer formed on the glass substrate and may satisfy a cross-cut adhesion test value according to ASTM D3359 of 4B or greater.

For example, the core distribution layer 24 may have the cross-cut adhesion test value of 5B or greater. Also, an electrically conductive layer that is the core distribution layer 24, may have an adhesive strength of 3 N/cm or more and a bonding strength of 4.5 N/cm or more with the glass substrate 21. When such a degree of bonding strength is satisfied, the bonding strength between the substrate and the electrically conductive layer is sufficient for applying as a packaging substrate.

An upper layer 26 is disposed on the first surface 213.

The upper layer 26 may comprise an upper distribution layer 25 and an upper surface connecting layer 27 disposed on the upper distribution layer 25. The uppermost surface of the upper layer 26 may be protected by a cover layer 60 having an opening part formed thereon, which is capable of being in direct contact with a connecting electrode of the semiconductor element unit.

The upper distribution layer 25 includes an upper insulating layer 253 disposed on the first surface; and an upper distribution pattern 251 that has a predetermined pattern and is an electrically conductive layer at least a part of which is electrically connected to the core distribution layer 24, for example, by a blind via 252, and built in the upper insulting layer.

Anything applied as an insulating layer to a semiconductor element, or a packaging substrate is applicable to the upper insulating layer 253, for example, an epoxy-based resin comprising a filler may be applied, but the present disclosure is not limited thereto.

The insulating layer may be formed by a method of forming and hardening a coating layer, or by a method of laminating an insulating film which is filmizated in a state of non-hardened or semi-hardened to a core layer and hardening it. In this time, when a method of pressure sensitive lamination and the like is applied, the insulator is embedded even in the space inside a core via, and thus efficient process proceeding can be made. Also, even though plural-layered insulating layers are applied with being stacked, substantial distinction between the layers may be difficult, so that a plurality of insulating layer are collectively referred to as an upper insulating layer. Also, the core insulating layer 223 and the upper insulating layer 253 may be applied with the same insulating material, and in this case, the boundary therebetween may not be substantially distinguished.

The upper distribution pattern 251 refers to an electrically conductive layer disposed in the upper insulating layer 253 in a predetermined form. For example, the upper distribution pattern 251 may be formed by a method of a build-up layer method. In detail, the upper distribution pattern 251 where electrically conductive layer is vertically or horizontally formed in a desired pattern may be formed by repeating a process of: forming an insulating layer; removing an unnecessary part of the insulating layer and then forming an electrically conductive layer through a method of copper plating and the like; removing an unnecessary part of the electrically conductive layer and then forming an insulating layer on this electrically conductive layer again; and removing an unnecessary part again and then forming an electrically conductive layer through a method of plating and the like.

Since the upper distribution pattern 251 is disposed between the core layer 22 and the semiconductor element unit 30, it is formed to at least partially include a fine pattern so that the transmission of electrical signals with the semiconductor element unit 30 may proceed smoothly and a desired complicated pattern may be sufficiently accommodated. In this case, the fine pattern may have a width and an interval of about less than 4 μm (micrometers), about 3.5 μm or less, about 3 μm or less, about 2.5 μm or less, or about 1 μm to about 2.3 μm, respectively (hereinafter, the description of the fine pattern is the same).

In order to form the upper distribution pattern 251 to include a fine pattern, at least two or more methods are applied in the present disclosure.

One of them, is to apply a glass-applied glass substrate 21, as a material for packaging substrate. The glass substrate 21 can have a considerably flat surface property with a surface roughness (Ra) of 10 angstroms or less, thereby minimizing the influence of surface morphology of a supporting substrate on formation of the fine pattern.

The other one, is based on the property of the insulating layer. In case of the insulating layer, a filler component is often applied in addition to resin, and inorganic particles such as silica particles may be applicable as the filler. When the inorganic particles are applied to the insulating layer as the filler, the size of the inorganic particles can affect whether to form the fine pattern, and therefore, the insulating layer in the embodiment applies particle fillers with an average diameter of about 150 nm (nanometers) or less, and in detail, including particle fillers with an average diameter of about 1 to about 100 nm. Such a characteristic can minimize the influence of the insulating layer itself on the formation of an electrically conductive layer with a width of several micrometer-unit, while maintaining necessary properties for the insulating layer at a certain level or more, and can also help to form a fine pattern with good adhesion onto the surface, due to the fine surface morphology.

The upper surface connecting layer 27 includes an upper surface connecting pattern 272 and an upper surface connecting electrode 271.

An upper surface connecting pattern 272 is at least a part of which is electrically connected to the upper distribution pattern 251, and is disposed in the upper insulating layer 253. An upper surface connecting electrode 271 electrically connects the semiconductor element unit 30 and the upper surface connecting pattern 272.

The upper surface connecting pattern 272 may be disposed on one surface of the upper insulating layer 253 or may be embedded with at least a part of which is being exposed on the upper insulating layer. For example, when the upper surface connecting pattern is disposed on one side of the upper insulating layer, the upper insulating layer may be formed by a method of plating and the like. Also, when the upper surface connecting pattern is embedded with at least a part of which is being exposed on the upper insulating layer, it may be the one which is formed by forming a copper plating layer and the like, and then a part of an insulating layer or electrically conductive layer is removed by a method of surface polishing, surface etching and the like.

The upper surface connecting pattern 272 may at least partially include a fine pattern like the above-described upper distribution pattern 251. The upper surface connecting pattern 272 including the fine pattern like this may enable a larger number of elements to be electrically connected to one another even in a narrow area, facilitate electrical signal connection between elements or with the external, and more integrated packaging is possible.

The upper surface connecting electrode 271 may be connected to the semiconductor element unit 30 directly through a terminal and the like, or via an element connecting unit 51 such as a solder ball of connecting unit 50.

The packaging substrate 20 is also connected to the motherboard 10. The motherboard 10 may be directly connected to the second surface distribution pattern 241c, which is a core distribution layer disposed on at least a part of the second surface 214 of the core layer 22, through a motherboard terminal or may be electrically connected via a board connecting unit 52 such as a solder ball of connecting unit 50. Also, the second surface distribution pattern 241c may be connected to the motherboard 10 via the lower layer 29 disposed under the core layer 22.

The lower layer 29 includes a lower distribution layer 291 and a lower surface connecting layer 292.

The lower distribution layer 291 includes a lower insulating layer 291b; and a lower distribution pattern 291a.

A lower insulating layer 291b is an insulating layer at least a part of which is in contact with the second surface 214. A lower distribution pattern 291a is being embedded in the lower insulating layer and having a predetermined pattern, and at least a part of which is electrically connected to the core distribution layer.

The lower surface connecting layer 292 may further include a lower surface connecting electrode 292a and/or a lower surface connecting pattern 292b. The lower surface connecting electrode 292a is electrically connected to the lower surface connecting pattern. The lower surface connecting pattern 292b is at least a part of which is electrically connected to the lower distribution pattern, and at least a part of which is exposed to one surface of the lower insulating layer.

The lower surface connecting pattern 292b may be formed as a non-fine pattern wider than the fine pattern, unlike the upper surface connecting pattern 272. In this case, more efficient transmitting of electrical signals at a part connected to the motherboard 10 is possible.

Not applying a substantially additional different substrate other than the glass substrate 21 to the packaging substrate 20 disposed between the semiconductor element unit 30 and the motherboard 10, is one feature of the present disclosure.

Conventionally, an interposer and an organic substrate were applied with being stacked between connection of the element and the motherboard. It is considered that such a multi-stage form has been applied for at least two reasons. One reason is that there is a scale problem in directly bonding the fine pattern of the element to the motherboard, and the other reason is that problem of wiring damage may occur due to a difference in thermal expansion coefficient during the bonding process or during the driving process of the semiconductor apparatus. The embodiment has solved these problems by applying the glass substrate with a thermal expansion coefficient similar to that of the semiconductor element, and by forming a fine pattern with a fine scale enough to mount the elements on the first surface of the glass substrate and its upper layer.

The semiconductor apparatus 100 having a considerably thin packaging substrate 20 may make the overall thickness of the semiconductor apparatus thinner, and it is also possible to dispose a desired electrical connecting pattern even in a narrower area by applying the fine pattern.

In detail, the packaging substrate may have a thickness of about 2000 μm or less, about 1500 μm or less, or about 900 μm. Also, the packaging substrate 20 may have a thickness of about 120 μm or more, or about 150 μm or more. Due to the above-described characteristics, the packaging substrate can stably connect the element and the motherboard electrically and structurally even with a relatively thin thickness, thereby contributing to miniaturization and thinning of the semiconductor apparatus.

A manufacturing method of the packaging substrate according to one or more other embodiments will be described below.

The manufacturing method of the packaging substrate of the embodiment comprises a preparation step of forming a defect at predetermined positions of a first surface and a second surface of a glass substrate; an etching step of preparing a glass substrate with a core via formed thereon by applying an etchant to the glass substrate where the defect is formed; a core layer forming step of plating the surface of the glass substrate with the core via formed thereon, to form a core distribution layer which is an electrically conductive layer, and thereby forming a core layer; and an upper layer forming step of forming an upper distribution layer, which is an electrically conductive layer surrounded by an insulting layer on one side of the core layer, and thereby manufacturing the packaging substrate described above.

The type of defect is formed by considering a type of via to be formed. Due to such a defect, a core via is formed at the defect in an etching step, and outstanding workability may be achieved, compared to working separately by drill to form a via in an organic substrate.

The core layer forming step may comprise a pretreatment process of preparing a pretreated glass substrate by forming an organic-inorganic composite primer layer containing a nanoparticle with amine-group on a surface of the glass substrate where the core via is formed; and a plating process of plating a metal layer on the glass substrate which is pretreated.

For the formation of the primer layer, different kinds of metals such as titanium, chromium, and nickel may be sputtered with copper, etc., or alone, and in this case, adhesiveness of glass-metal may be improved by surface morphology of glass, an anchor effect which is an interaction between metal particles, and the like, and it may serve as a seed in a subsequent plating process and the like.

An insulating layer forming step may be further comprised between the core layer forming step and the upper layer forming step.

The insulating layer forming step may be a step of positioning an insulating film on the core layer and performing pressure sensitive lamination to form a core insulating layer.

Manufacturing method of packaging substrate will now be described in more detail.

1) Preparation Step (Glass Defect Forming Process): A glass substrate 21a having flat first surface and second surface was prepared, and a defect (groove) 21b was formed at a predetermined position on the surface of the glass substrate to form a core via as illustrated, for example, in (a) of FIG. 7. As the glass substrate, a glass substrate applied to a substrate for electronic apparatus, etc., for example, non-alkalic glass substrate, etc. is applicable, but not limited thereto. As a commercial product, product manufactured by manufacturers such as CORNING, SCHOTT, AGC may be applied. For formation of the defect (groove), a method of mechanical etching, laser irradiation, and the like can be applied.

2) Etching Step (Core Via Forming Step): On the glass substrate 21a where the defect (groove) 21b formed, a core via 23 is formed through a physical or chemical etching process as illustrated, for example, in (b) of FIG. 7. During the etching process, the glass substrate forms vias in the parts with defect, and at the same time, the surface of the glass substrate 21a may be simultaneously etched. A masking film may be applied to prevent the etching of the glass surface, but the defective glass substrate itself may be etched in consideration of the inconvenience, etc. of the process of applying and removing the masking film, and in this case, a thickness of the glass substrate having the core via may be slightly thinner than the thickness of the first glass substrate.

Chemical etching may be proceeded by placing a glass substrate where a groove is formed, in a bath containing hydrofluoric acid and/or nitric acid, and applying ultrasonic treatment, etc. In this case, the hydrofluoric acid concentration may be 0.5 M or more, and may be 1.1 M or more. The hydrofluoric acid concentration may be 3 M or less, and may be 2 M or less. The nitric acid concentration may be 0.5 M or more, and may be 1 M or more. The nitric acid concentration may be 2 M or less. The ultrasonic treatment may be performed at a frequency of 40 Hz to 120 Hz, and may be performed at a frequency of 60 Hz to 100 Hz.

When applied under these conditions, it is possible to prepare a glass substrate with improved workability while reducing residual stress on the glass substrate where the via is formed.

3-1) Core Layer Forming Step: An electrically conductive layer 21d is formed on the glass substrate as illustrated, for example, in (d) of FIG. 7. As for the electrically conductive layer, a metal layer typically containing copper metal may be applied, but not limited thereto.

A surface of the glass (including a surface of a glass substrate and a surface of a core via) and a surface of the copper metal have different properties, so the adhesion strength is rather poor. In the embodiment, the adhesion strength between the glass surface and the metal is improved by two methods, a dry method and a wet method.

Figure 7:
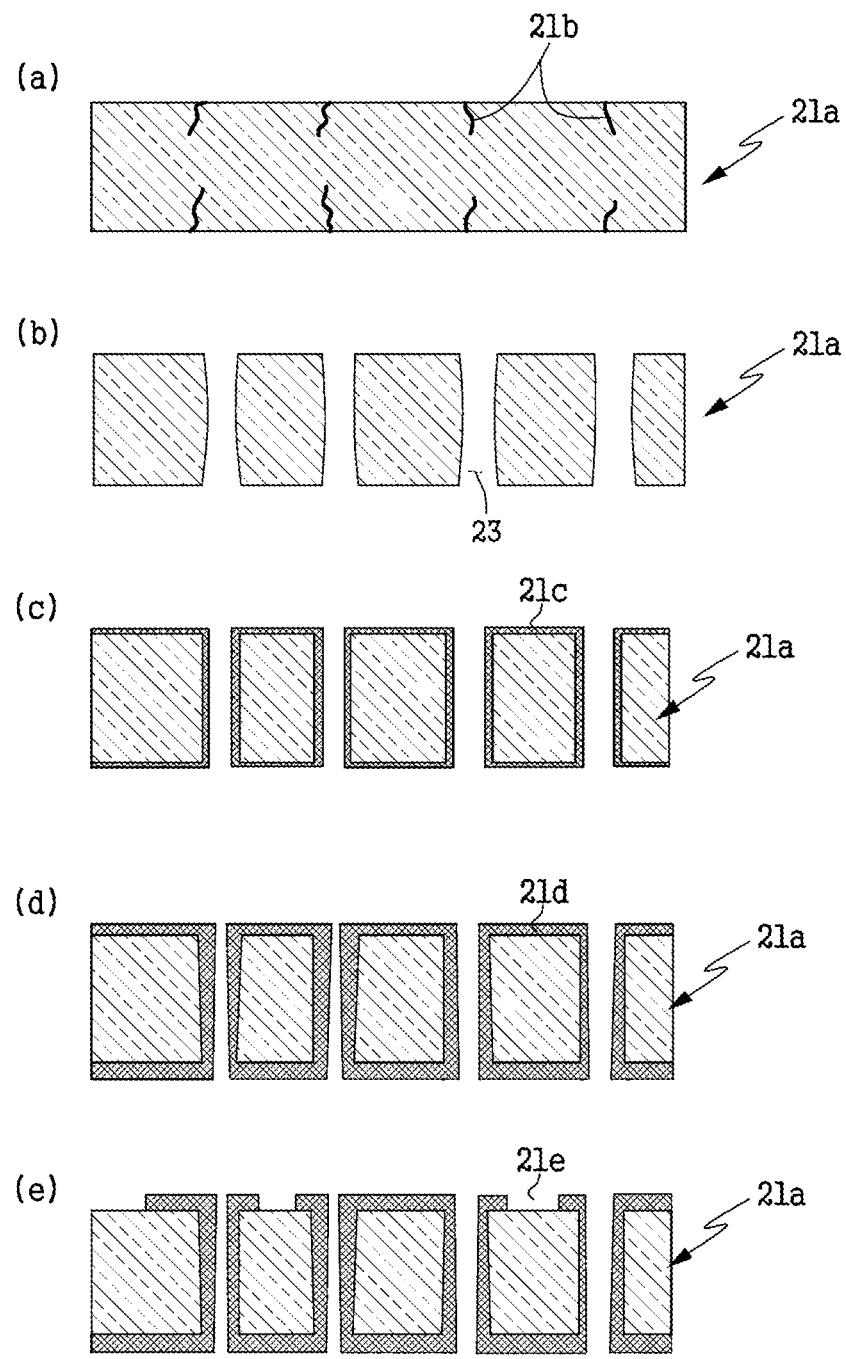
FIGS. 7, 8, and 9 are flowcharts illustrating a cross-sectional view of a manufacturing process of a packaging substrate according to the embodiments.

The dry method is a method applying sputtering, that is, a method of forming a seed layer 21c inside the core via and on the glass surface through metal sputtering as illustrated, for example, in (c) of FIG. 7. For the formation of the seed layer, different kinds of metals such as titanium, chromium, and nickel may be sputtered with copper, etc., and in this case, it is considered that the adhesiveness of glass-metal is improved by surface morphology of glass, an anchor effect which is an interaction between metal particles, and the like.

The wet method is a method applying primer treatment, that is, a method of forming a primer layer 21c by performing pre-treatment with a compound having a functional group such as amine as also illustrated, for example, in (c) of FIG. 7. After pre-treatment by using a silane coupling agent depending on the degree of intended adhesion strength, primer treatment may be done with a compound or particles having an amine functional group. As mentioned above, a supporting body substrate of the embodiment needs to be of high performance enough to form a fine pattern, and it should be maintained after the primer treatment. Therefore, when such a primer includes a nanoparticle, it is desirable to apply a nanoparticle with an average diameter of 150 nm or less, for example, a nanoparticle is desirable to be applied to a particle with amine functional group. The primer layer may be formed by applying an adhesive strength improving agent manufactured in CZ series by MEC Inc, for example.

In the seed layer/primer layer 21c, an electrically conductive layer may selectively form a metal layer in the state of removing a part where the formation of an electrically conductive layer is unnecessary, or not removing.

Also, in the seed layer/primer layer 21c, a part where the formation of an electrically conductive layer is necessary, or a part where the formation of an electrically conductive layer is unnecessary, may be selectively processed to be an activated state or an inactivated state for metal plating. The processing to be an activated state or an inactivated state may be performed, for example, by using light irradiation treatment such as laser light of a certain wavelength, etc., chemical treatment, and the like. A copper plating method, etc. applied for manufacturing a semiconductor element may be applied to form the metal layer, but not limited thereto.

During the metal plating, a thickness of an electrically conductive layer formed, may be controlled by regulating several variables such as the concentration of plating solution, plating time, and type of additive to be applied.

When a part of the core distribution layer is unnecessary, it can be removed, and an etching layer 21e of a core distribution layer may be formed by performing metal plating to form an electrically conductive layer as a predetermined pattern, after the seed layer is partially removed or processed to be inactivated as illustrated, for example, in (e) of FIG. 7.

Figure 8:
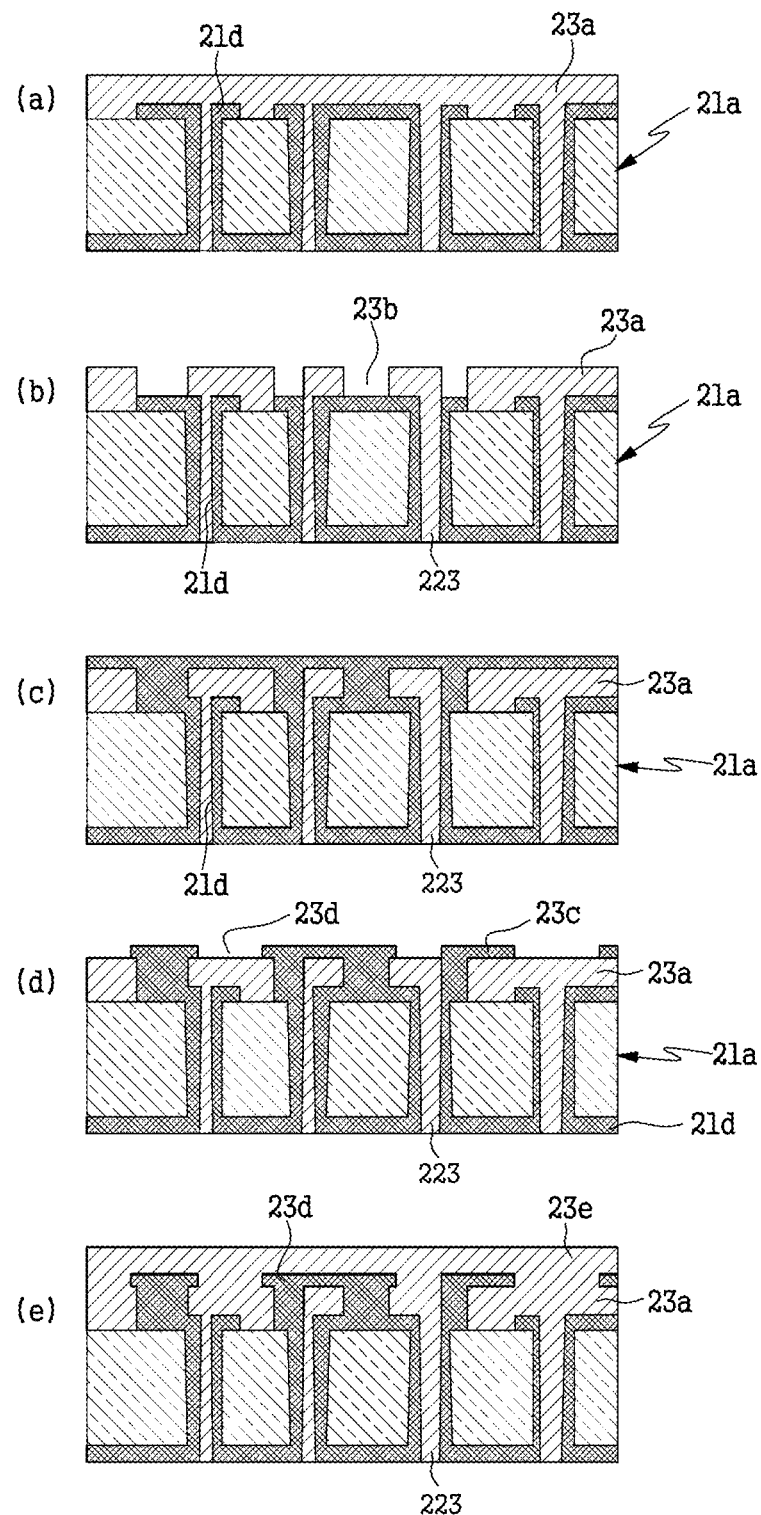

3-2) Insulating Layer Forming Step: An insulating layer forming step in which an empty space of a core via is filled with an insulating layer after the core distribution layer, which is an electrically conductive layer, is formed, may be performed as illustrated, for example, in (a) of FIG. 8. In this case, the one manufactured in a film type may be applied to the applied insulating layer, and for example, a method such as pressure sensitive laminating the film-type insulating layer may be applied. When proceeding the pressure sensitive laminating like this, the insulating layer may be sufficiently subsided to the empty space inside the core via to form a core insulating layer without void formation.

4) Upper Layer Forming Step: It is a step for forming an upper distribution layer including an upper insulating layer and an upper distribution pattern on a core layer as illustrated, for example, in (a), (b), (c), (d), and (e) of FIG. 8. The upper distribution layer may be formed by a method of coating a resin composition forming an insulating layer 23a, or laminating an insulating film. For simplicity, applying a method of laminating an insulating film is desirable. The laminating of the insulating film may be proceeded by a process of laminating and then hardening, and in this case, if a method of the pressure sensitive lamination is applied, the insulating resin may be sufficiently subsided even into a layer where an electrically conductive layer is not formed inside the core via. The upper insulating layer is also in direct contact with a glass substrate at least in part thereof, and thus the one with a sufficient adhesive force is applied. Specifically, it is desirable that the glass substrate and the upper insulating layer have characteristics that satisfy an adhesion strength test value of 4B or more according to ASTM D3359.

The upper distribution pattern may be formed by repeating a process of forming the insulating layer 23a, forming an electrically conductive layer 23c to have a predetermined pattern, and forming an etching layer 23d of the electrically conductive layer by etching the unnecessary part, and in the case of an electrically conductive layer formed to neighbor with having an insulating layer placed therebetween, it may be formed by a method of performing a plating process after forming a blind via 23b in the insulating layer. For formation of the blind via, a dry etching method such as laser etching and plasma etching, and a wet etching method using a masking layer and an etching solution may be applied.

Figure 9:
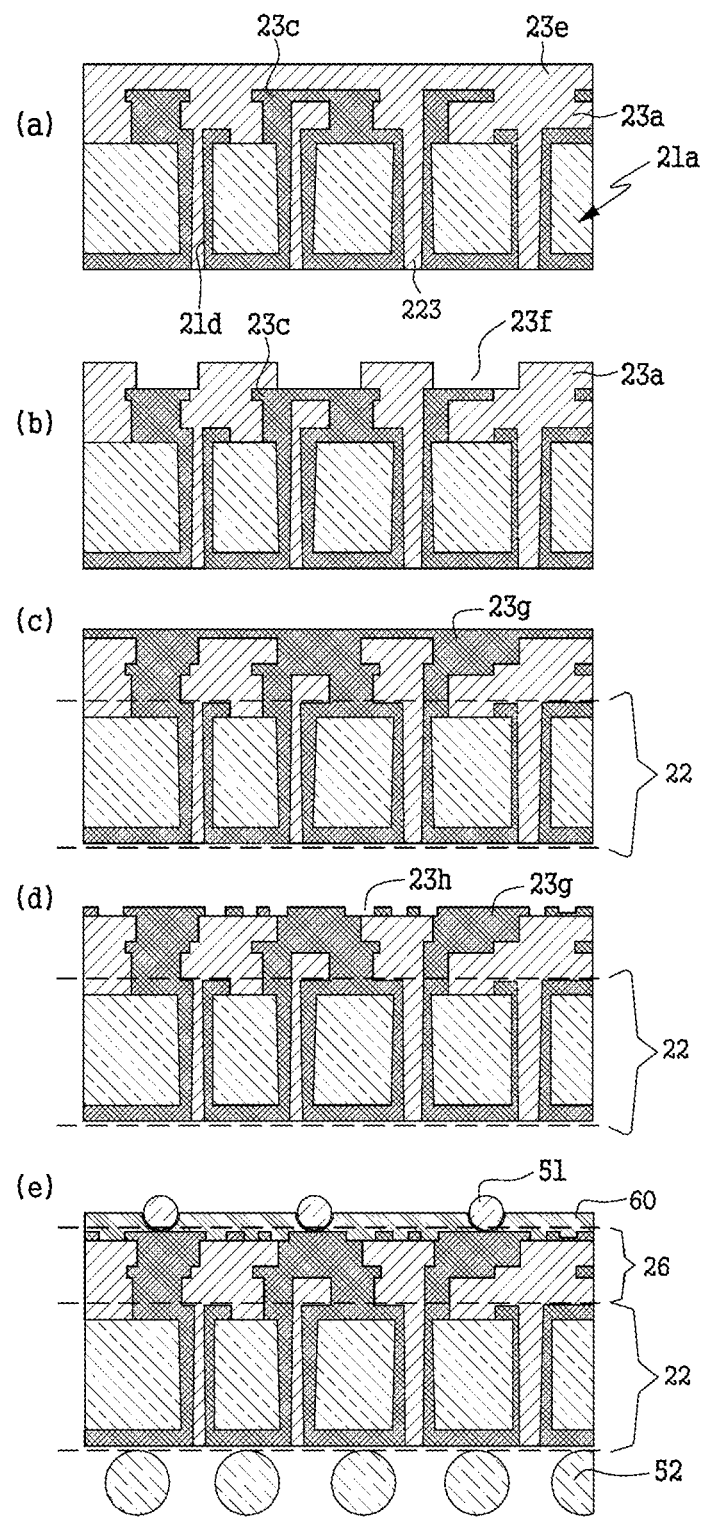

5) Upper Surface Connecting Layer and Cover Layer Forming Step: Upper surface connecting pattern and upper surface connecting electrode may be performed by a process similar to forming the upper distribution layer as illustrated, for example, in (a), (b), (c), (d), and (e) of FIG. 9. Specifically, it may be formed by a method such as forming an etching layer 23f of an insulating layer 23e on the insulating layer 23e, and then forming an electrically conductive layer 23g again thereon, and then forming an etching layer 23h of the electrically conductive layer, but a method of selectively forming only an electrically conductive layer without applying a method of etching, may be also applied. A cover layer 60 may be formed to have an opening part (not shown) at a position corresponding to the upper surface connecting electrode such that the upper surface connecting electrode to be exposed and directly connected to an element connection unit 51, a terminal of an element, or the like.

6) Lower Surface Connecting Layer and Cover Layer Forming Step: A lower distribution layer and/or a lower connecting layer, and optionally a cover layer (not shown) may be formed in a manner similar to the upper surface connecting layer and the cover layer forming step, described above.

Hereinafter, the present disclosure will be described in more detail through specific examples. The following examples are only examples to help the understanding of the present disclosure, and the scope of the present disclosure is not limited thereto.

Example 1—Manufacturing of Substrate Where a Core Via is Formed

1) Preparation Step (Glass Defect Forming Process): A glass substrate 21a having a flat first surface and a second surface was prepared, and defects (grooves, 21b) were formed on the glass surface at a predetermined position for forming a core via. In this case, the number of defects were allowed to form in the number of 225 or 1024 per 1 $cm^2$. As the glass, borosilicate glass was applied. A method of mechanical etching and laser irradiation were applied to the formation of the defect (groove).

2) Etching Step (Core Via Forming Step): The core via 23 was formed on the glass substrate 21a where the defects (grooves, 21b) were formed, through a physical or chemical etching process. The etching was performed by a method of placing the glass substrate in an etching bath filled with 2 M hydrofluoric acid (HF), 1.1 M nitric acid ($HNO_3$) and deionized water, and applying ultrasonic waves at 80 Hz and 100% output.

Also, the core vias were formed to have a first opening part in contact with the first surface; a second opening part in contact with the second surface; and a minimum inner diameter part, which is the area whose diameter is the narrowest in the entire core via connecting the first opening part and the second opening part.

Example 2—Manufacturing of Substrate Where a Core Via is Formed

A substrate was manufactured in the same manner as in Example 1, except that the condition of the ultrasonic output was changed to 80%.

Example 3—Manufacturing of Substrate Where a Core Via is Formed

A substrate was manufactured in the same manner as in Example 1, except that an etching was performed by placing the glass substrate in an etching bath filled with 1.1 M hydrofluoric acid (HF), 1.1 M nitric acid (HNO$_3$) and deionized water, and then etching at 80 Hz, 100% output.

Example 4—Manufacturing of Substrate Where a Core Via is Formed

A substrate was manufactured in the same manner as in Example 3, except that the condition of the ultrasonic output during etching was changed to 80%.

Experimental Examples—Stress Measurement of Glass Substrate

The stress was analyzed by applying a birefringence 2D evaluation device. In detail, WPA-200 device of NPM (NIPPON PULSE KOREA CO., LTD) was applied to the birefringence 2D dispersion evaluation device.

An average diameter of the opening part was 100 μm, an average diameter of the minimum inner diameter part was 75 μm, and the stress of plain line and via line of four glass substrate samples with an average thickness of about 300 μm was measured while changing the positions 4 times or more, respectively. About the number of 225 or 1024 core vias per unit area (1 cm$^2$) were formed on the glass substrate.

Specifically, when data was read on a glass substrate along the stress measurement path shown in FIG. 2 with a probe, a measured value such as a birefringence value was input to the device, and the stress in the measurement path was presented in pressure units (e.g., MPa) through a predetermined calculation process. The photo-elastic coefficient value of 2.4 was applied, and the thickness was applied as 300 μm.

The measured results are shown as average in the below Tables 1 and 2, respectively, and the Vp, Np, and P values, etc. evaluated by using them are also shown in Table 1 or Table 2 below.

Manufactured Examples—Manufacturing of Packaging Substrate 3-1) Core Layer Forming Step: An electrically conductive layer 21$d$ was formed on a glass substrate. As the electrically conductive layer, a metal layer containing copper metal was applied. A sputtering layer containing titanium was formed and copper plating was performed.

3-2) Insulation Layer Forming step: After forming the core distribution layer, which is an electrically conductive layer, an insulating layer forming step of filling the empty space with an insulating layer was performed. At this time, the one manufactured in the form of a film was applied to the applied insulating layer, and a method of pressure sensitive lamination of the insulating layer in the form of a film was applied.

4) Upper Layer Forming Step: A step of forming an upper distribution layer including an upper insulating layer and an upper distribution pattern on the core layer was performed. A method of laminating an insulating film as the upper insulating layer was performed, and a process of lamination and hardening of the insulating was performed. The one at least a part of which is in direct contact with the glass substrate, and thus has a sufficient adhesive force, was also applied to the upper insulating layer. Specifically, the one having properties that satisfy an adhesion test value of 4B or more according to ASTM D3359, were applied to the glass substrate and the upper insulating layer The upper distribution pattern was formed by repeating the process of forming the insulating layer 23$a$, forming an electrically conductive layer 23$c$ in a predetermined pattern, and etching unnecessary parts to form an etching layer 23$d$ of an electrically conductive layer. In the case of an electrically conductive layer formed adjacent to each other with an insulating layer disposed therebetween, it was formed by a method of forming a blind via 23$b$ in the insulating layer and then performing a plating process. For the formation of the blind via, a dry etching method such as laser etching and plasma etching, and a wet etching method using a masking layer and an etchant were applied to manufacture a packaging substrate.

All samples applied to manufacture were formed into packaging substrates without damage.

TABLE 1

| (MPa) | Via line (Width) | | — | Via line (Length) | | — |
|---|---|---|---|---|---|---|
| | Min | Max | — | Min | Max | — |
| Example 1 | 0.03175 | 1.8855 | — | 0.10275 | 1.60825 | — |
| Example 2 | 0.0315 | 1.062 | — | 0.1975 | 0.782 | — |
| Example 3 | 0.04225 | 1.844 | — | 0.05375 | 1.56525 | — |
| Example 4 | 0.04275 | 1.97675 | — | 0.14975 | 1.7165 | — |

| (MPa) | Plain line (Width) | | — | Plain line (Length) | | — |
|---|---|---|---|---|---|---|
| | Min | Max | — | Min | Max | — |
| Example 1 | 0.169 | 0.89475 | — | 0.2055 | 0.77325 | — |
| Example 2 | 0.0845 | 0.90175 | — | 0.263 | 0.71125 | — |
| Example 3 | 0.047 | 0.51625 | — | 0.07025 | 0.4895 | — |
| Example 4 | 0.0875 | 0.69275 | — | 0.19925 | 0.69875 | — |

| (MPa) | Vp (Width) | Vp (Length) | Np (Width) | Np (Length) | P (Width) | P (Length) |
|---|---|---|---|---|---|---|
| Example 1 | 1.85 | 1.51 | 0.73 | 0.57 | 1.13 | 0.94 |
| Example 2 | 1.03 | 0.58 | 0.82 | 0.45 | 0.21 | 0.14 |
| Example 3 | 1.80 | 1.51 | 0.47 | 0.42 | 1.33 | 1.09 |
| Example 4 | 1.93 | 1.57 | 0.61 | 0.50 | 1.33 | 1.07 |

TABLE 2

| | Via line (Width) | | | | |
|---|---|---|---|---|---|
| MPa | Min | Max | Max-Min | Avg | K |
| Example 1 | 0.03175 | 1.88550 | 1.85375 | 0.44575 | 4.15872 |
| Example 2 | 0.03150 | 1.06200 | 1.03050 | 0.45625 | 2.25863 |
| Example 3 | 0.04225 | 1.84400 | 1.80175 | 0.30200 | 5.96606 |
| Example 4 | 0.04275 | 1.97675 | 1.93400 | 0.41325 | 4.67998 |
| | Via line (Length) | | | | |
| MPa | Min | Max | Max-Min | Avg | K |
| Example 1 | 0.10275 | 1.60825 | 1.50550 | 0.52800 | 2.85133 |
| Example 2 | 0.19750 | 0.78200 | 0.58450 | 0.46375 | 1.26038 |
| Example 3 | 0.05375 | 1.56525 | 1.51150 | 0.29475 | 5.12807 |
| Example 4 | 0.14975 | 1.71650 | 1.56675 | 0.42725 | 3.66706 |
| | Plain line (Width) | | | | |
| MPa | Min | Max | Max-Min | Avg | K |
| Example 1 | 0.16900 | 0.89475 | 0.72575 | 0.44200 | 1.64197 |
| Example 2 | 0.08450 | 0.90175 | 0.81725 | 0.44850 | 1.82219 |
| Example 3 | 0.04700 | 0.51625 | 0.46925 | 0.24625 | 1.90558 |
| Example 4 | 0.08750 | 0.69275 | 0.60525 | 0.37050 | 1.63360 |
| | Plain line (Length) | | | | |
| MPa | Min | Max | Max-Min | Avg | K |
| Example 1 | 0.20550 | 0.77325 | 0.56775 | 0.45725 | 1.24166 |
| Example 2 | 0.26300 | 0.71125 | 0.44825 | 0.48500 | 0.92423 |
| Example 3 | 0.07025 | 0.48950 | 0.41925 | 0.23250 | 1.80323 |
| Example 4 | 0.19925 | 0.69875 | 0.49950 | 0.39525 | 1.26376 |

Referring to Tables 1 and 2, it was confirmed that the glass substrate having the above-mentioned degree of residual stress in the plain line and the via line, respectively, had sufficient processability as a packaging substrate. The smaller the difference in stress, the more stable work is possible in the subsequent process, however, in the case of degree confirmed above, all have an adequate processability. In the case of samples that the formation of crack and the etching in strong acid without applying ultrasonic waves were performed, although the data were not clearly presented above, but damage occurred during sputtering or the formation of the insulating layer, so it was confirmed that it is desirable to apply the ultrasonic waves together during the etching process.

While specific examples have been illustrated and described above, it will be apparent after gaining an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A packaging glass substrate for semiconductor comprising:
a glass substrate with a first surface and a second surface facing each other; and
a plurality of core vias penetrating through the glass substrate in a thickness direction,
wherein a plain line is a line linking places where the core vias are not formed,
wherein a via line is a line linking places where the core vias are formed, and
wherein a stress difference value (P) is a value according to Equation (1), and the stress difference value (P) is 1.5 MPa or less, $$P = Vp - Np \quad \text{Equation (1)}$$

where P is a stress difference value measured at the same glass substrate, Vp is a difference between the maximum value and the minimum value of stress measured at the via line, and Np is a difference between the maximum value and the minimum value of stress measured at the plain line.

2. The packaging glass substrate for semiconductor of claim 1, wherein the Vp value is 2.5 MPa or less.

3. The packaging glass substrate for semiconductor of claim 1, wherein the Np value is 1.0 MPa or less.

4. The packaging glass substrate for semiconductor of claim 1, wherein the core vias are disposed in the number of 100 to 3000, based on a unit area (1 cm×1 cm) of the glass substrate.

5. A packaging substrate for semiconductor comprising:
the packaging glass substrate for semiconductor of claim 1;
a core layer disposed on a surface of the core via; and
a core seed layer configured as a seed for forming an electrically conductive layer.

6. The packaging substrate for semiconductor of claim 5, wherein the electrically conductive layer comprises a core distribution pattern.

7. A semiconductor apparatus comprising:
a semiconductor element unit comprising one or more semiconductor elements;
the packaging substrate for semiconductor of claim 5 electrically connected to the semiconductor element unit; and
a motherboard electrically connected to the packaging substrate, transmitting electrical signals of the one or more semiconductor element units and externally, and connected to the one or more semiconductor elements.

8. A packaging glass substrate for semiconductor comprising:
a glass substrate with a first surface and a second surface facing each other; and
a plurality of core vias penetrating through the glass substrate in a thickness direction,
wherein a plain line is a line linking places where the core vias are not formed,
wherein a via line is a line linking places where the core vias are formed,
wherein a target line is a plain line or a via line, and
wherein a stress difference ratio (K) is a value according to Equation (2), and the stress difference ratio (K) is 6 or less, $$K = Lp/La \quad \text{Equation (2)}$$

where K is a stress difference ratio measured at the same plane of the same glass substrate, Lp is a difference between the maximum value and the minimum value of stress measured at the target line, and La is an average value of stress measured at the target line, and
wherein when Vp is a difference between the maximum value and the minimum value of stress measured at the via line and Np is a difference between the maximum value and the minimum value of stress measured at the plain line, the Vp is 0.2 MPa to 2.5 MPa and the Np is 0.2 MPa to 1.0 MPa.

9. The packaging glass substrate for semiconductor of claim 8,
wherein the target line is a plain line, and
wherein the stress difference ratio (K) is 2 or less.

10. The packaging glass substrate for semiconductor of claim 8, wherein the target line is a via line.

11. The packaging glass substrate for semiconductor of claim 8, wherein the core vias are disposed in the number of 100 to 3000, based on a unit area (1 cm×1 cm) of the glass substrate.

12. A packaging substrate for semiconductor comprising:
the packaging glass substrate for semiconductor of claim 8;
a core layer disposed on a surface of the core via; and
a core seed layer configured as a seed for forming an electrically conductive layer.

13. The packaging substrate for semiconductor of claim 12, wherein the electrically conductive layer comprises a core distribution pattern.

14. A semiconductor apparatus comprising:
a semiconductor element unit comprising one or more semiconductor elements;
the packaging substrate for semiconductor of claim 12 electrically connected to the semiconductor element unit; and
a motherboard electrically connected to the packaging substrate, transmitting electrical signals of the one or more semiconductor elements and external signals, and connected to the semiconductor element unit.

* * * * *